United States Patent [19]
Doll et al.

[11] Patent Number: 5,398,639
[45] Date of Patent: Mar. 21, 1995

[54] SOLID STATE CONVERSION OF HEXAGONAL TO CUBIC-LIKE BORON NITRIDE

[75] Inventors: Gary L. Doll, Southfield; Joseph P. Heremans, Troy, both of Mich.

[73] Assignee: General Motors Corporation, Detroit, Mich.

[21] Appl. No.: 150,312

[22] Filed: Nov. 12, 1993

[51] Int. Cl.⁶ .............................................. C30B 1/10
[52] U.S. Cl. ...................................... 117/4; 117/7; 117/9; 117/10; 117/952
[58] Field of Search ..................... 117/4, 7, 9, 10, 952

[56] References Cited

U.S. PATENT DOCUMENTS

| 4,188,194 | 2/1980 | Corrigan | 51/307 |
| 4,289,503 | 9/1981 | Corrigan | 51/307 |
| 4,545,968 | 10/1985 | Hirano et al. | 501/96 |

FOREIGN PATENT DOCUMENTS 49-130399 12/1974 Japan .................................. 117/952

OTHER PUBLICATIONS

Vel et al, "Cubic Boron Nitride: Synthesis, Physicochemical Properties and Applications", Materials Science and Engineering, Big (1991) pp. 149–164.

*Primary Examiner*—Robert Kunemund
*Attorney, Agent, or Firm*—Cary W. Brooks

[57] ABSTRACT

Films of hexagonal boron nitride are converted to a highly desirable cubic-like phase of boron nitride. The transformation is achieved by annealing the hBN material at temperatures below 1000° C. The conversion may be conducted in a hydrogen, nitrogen, ammonia, vacuum, or inert gas containing atmosphere.

15 Claims, 1 Drawing Sheet

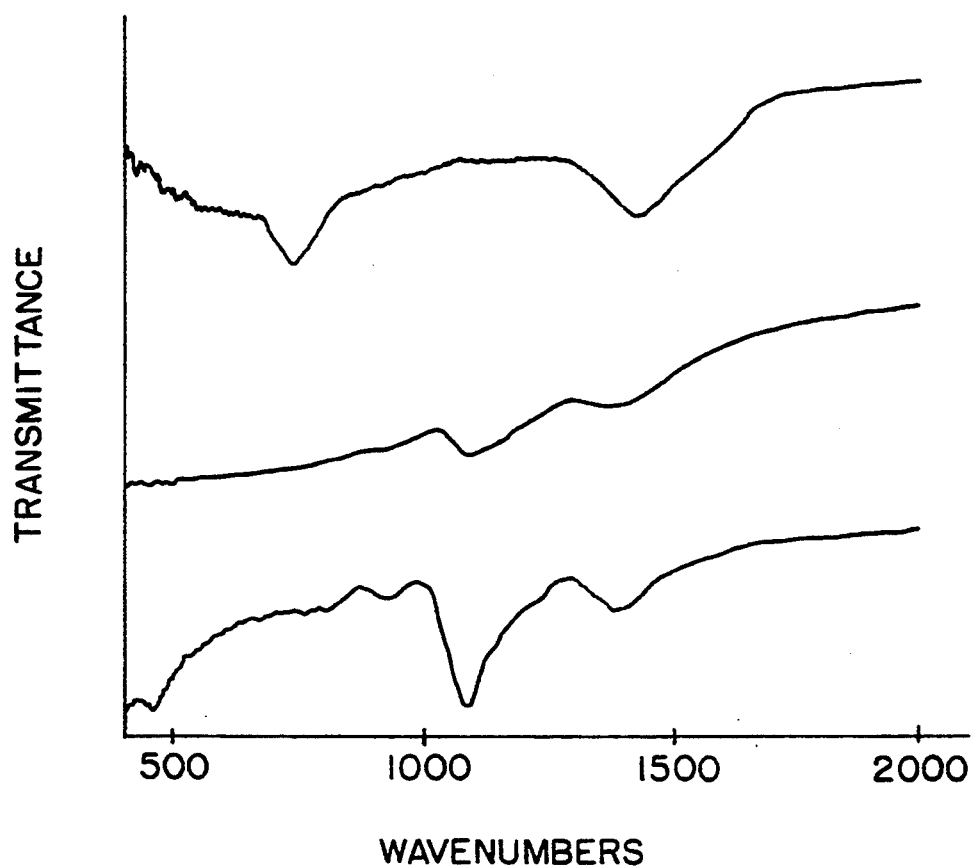

SOLID STATE CONVERSION OF HEXAGONAL TO CUBIC-LIKE BORON NITRIDE

FIELD OF THE INVENTION

This invention relates to the discovery that films of hexagonal boron nitride can be converted to a highly desirable cubic-like phase of boron nitride. The transformation is achieved by annealing the material at temperatures below 1000° C. The conversion may be conducted in a hydrogen, nitrogen, vacuum, ammonia, or an inert gas containing atmosphere.

BACKGROUND OF THE INVENTION

There are four main crystalline forms of boron nitride: hexagonal, rhombohedral, cubic, and wurtzitc. Hexagonal boron nitride (hBN) and rhombohedral boron nitride are structurally similar to graphite with sheets of $sp^2$-bonded hexagonal arrays of boron and nitrogen atoms. Hexagonal boron nitride is an extremely soft, electrical insulator with a poor thermal conductivity. It is mainly used as a high temperature solid lubricant and refractory material. On the other hand, cubic boron nitride (cBN) and wurtzitic boron nitride (wBN) are structurally similar to diamond, with tetrahedrally coordinated frameworks of $sp^3$ bonds. Consequently, cBN and wBN are extremely hard (the hardness of cBN is second to that of diamond), electrical insulators with excellent thermal conductivities (the thermal conductivity of cBN is second to that of diamond). Cubic boron nitride is currently used as a powder for abrasive processes, and as sintered ceramics for sawing, cutting, and crushing applications. Sintered cBN is particularly useful as inserts in high speed machining of hardened steels, chilled cast iron, carbides, and nickel or cobalt-based super alloys. Unlike diamond, cBN has a low reactivity with iron and steels, and its high thermostability in oxidizing conditions makes it a better candidate than diamond for engineering materials. Cubic boron nitride has potential applications that include wear resistant and protective coatings, thermal heat sinks for electronic devices, electrical insulators in silicon based devices, lattice matched substrates for diamond growth. Unlike diamond which can only be doped p-type to date, cBN can be doped both n-type and p-type. Cubic boron nitride is therefore potentially more suitable than diamond in high temperature and high power electronic and optoelectronic devices.

Hexagonal boron nitride is most commonly grown either in film or powder form by chemical vapor deposition (CVD). Typically, reactants such as $BCl_3$ and $NH_3$ are combined on substrates heated above 1000° in appropriate concentrations to form hexagonal boron nitride. The substrate temperature can be reduced considerably when the CVD process is excited by a plasma process such as hot filament, microwaves, or radio frequency waves. Cubic boron nitride films and powders are more difficult to produce. For example, cBN films are usually grown successfully only when a physical vapor deposition (PVD) process such as sputtering, e-beam evaporation, or laser deposition is modified with a beam of nitrogen or nitrogenic ions irradiating the target. These processes are either not easily scaled to high volume manufacturing (as in the case of laser deposition), or do not make films with adequate adhesion (sputtering and e-beam evaporation). Powders and crystals of cBN are produced by heating hBN to very high temperatures (2000° K.) under considerable pressures (11 GPa). The formation of cBN in this direct conversion occurs via a destructive-reconstructive diffusion-like process. The temperature and pressure of the transformation can be reduced slightly by adding a catalyst such as an alkaline or alkaline earth metal. In this catalyzed process, compounds are added to hBN in order to reduce the high activation energy through a eutectic interaction with the BN. The driving force for the formation of cBN is the solubility difference between hBN and cBN varieties in the eutectic flux. The catalyzed process is the main method used to produce cBN at the industrial scale. Hydrogen has never been reported as an effective catalyst for the conversion of hBN to cBN.

Recently, researchers at Pennsylvania State University, under the leadership of Prof. R. Roy, announced that they had discovered a process that successfully changes graphite to diamond at ambient pressures. In their process, graphitic carbon is molded into different shapes and is seeded with diamond or nickel particles. The seeded parts were then placed into a hydrogen plasma and heated to temperatures between 600° and 1000° C. It is believed that the structure of the carbon changes in this process from graphitic to diamond. Roy speculated that the process may be simply a plasma enhanced CVD process where the hydrogen plasma etches the graphitic carbon, and redeposits it as diamond. The plasma enhanced CVD technique is known to work well in growing diamond coatings. However, a plasma enhanced CVD process does not work well in growing cBN, so the use of a hydrogen plasma would not appear to be beneficial to forming cBN. This invention goes against the teachings of Roy, et al.

SUMMARY OF THE INVENTION

In the present invention, hBN films are subjected to hydrogen, nitrogen, $NH_3$, vacuum, or inert gas at temperatures between 600° C. and 1000° C. to convert them to cubic-like BN films. The conversion process using hBN films may be conducted on silicon substrates. The BN films were grown by pulsed laser deposition using an excimer laser under conditions that form 100% or nearly 100% hBN. The hBN films have poor crystallinity and small grain sizes. The hBN films were microcrystalline (for example 2.5–500 nanometers) with many defects. The defects include short range crystallinity, stacking disorders and/or atomic vacancies. These attributes are believed to lower the activation barrier energy between hBN and cBN and assist in the diffusion of atoms, elements desirable in the conversion of hBN to cBN. The high activation barrier is lowered by the use of an hBN starting material with a poor crystallinity and small particle size. Amorphous BN or hBN with limited crystal lattice structure are particularly suitable. The destruction of the lattice and the diffusion of atoms is easier in a material containing a high concentration of defects.

These and other objects, features and advantages of the present invention will be apparent from the following brief description of the drawing, detailed description and appended claims and drawings.

BRIEF DESCRIPTION OF THE DRAWINGS

FIG. 1 is a graphic illustration of the infrared transmittance of a film prior to, during and after the conversion process according to the present invention.

DETAILED DESCRIPTION

The hBN films used to produced cBN were approximately 100nm thick and appeared dark blue in color. The color arises from an optical interference effect typical of smooth transparent films on reflective substrates. Thin hBN films are most easily characterized by infrared spectroscopy since they do not scatter x-rays well and electron microscopy specimens are difficult and tedious to prepare. In fact, no x-ray diffraction peaks could be seen for the hBN films. The infrared transmittance for a film prior to annealing is shown as the top spectrum in FIG. 1. Hexagonal BN has two high frequency infrared active photons. These are the 1380 cm$^{-1}$ stretching and 780 cm$^{-1}$ B-N-B bending modes. These features are the dominant features of the infrared spectrum.

The hBN film may include a small fraction of cubic boron nitride. The presence of small amounts of cubic boron nitride may enhance the conversion of the hBN film to cubic-like boron nitride at the relatively low temperatures below 1000° C., for example 600° C. to less than 1000° C. The film was placed in a quartz tube and inserted in a high temperature vacuum furnace. The temperature of the furnace was ramped to approximately 900° C., and the furnace was evacuated to a pressure of approximately 10 milli Torr. After reaching the set point, hydrogen gas was introduced to the furnace, eventually establishing a pressure of 760 Torr (or 1 atmosphere). The film was annealed at 867° C. for 12 hours, then was allowed to cool at a rate of approximately 4° C. per minute for 200 minutes to a temperature of 50° C. No catalyst was required to convert hBN to cubic BN according to the present invention.

After reaching a temperature of 50° C., the sample was removed from the furnace and the infrared transmission spectrum was taken. This spectrum is shown as the middle trace in FIG. 1. In this spectrum, an absorption at 1080 cm$^{-1}$ appears with intensity equal to the hBN features. The 1080 cm$^{-1}$ peak is characteristic of cBN films. Qualitatively, this indicates that there are equal percentages of hBN and cBN in the film.

The sample was then placed back in the furnace for an additional 112 hours under identical annealing conditions that were used during the first 12 hours. After this annealing cycle, the sample was removed from the furnace and once again examined by infrared transmission. The spectrum (shown as the lower trace in FIG. 1) shows that the 1380 and 780 cm$^{-1}$ lines have decreased in intensity, and the 1080 cm$^{-1}$ cBN peak has emerged as the dominant feature of the spectrum. FIG. 1 also shows evidence of an optical absorption near 500 cm$^{-1}$ which is an electronic transition in elemental boron, and a weak absorption near 918 cm$^{-1}$ which has not been identified. The annealing of hBN films in hydrogen at these temperatures leads to the transformation of the hexagonal phase of BN to a cubic-like phase. Since infrared absorption spectroscopy is only sensitive to the chemical bonding of the atoms and not necessarily the structure, we conclude that the annealing process changes the sp$^2$-bonded BN of the hexagonal BN structure to an sp$^3$-bonding arrangement similar to cBN and wBN. Electron microscopy reveals that there is no noticeable crystallinity in the films, so we refer this note as cubic-like BN. We also note that concurrent with this transformation, nitrogen is lost from the film leaving behind regions of elemental boron.

The discovery that hBN can be converted to cubic-like BN could prove to be a significant advancement in coating technology for the electronics, machine tool, biomedical, and automotive industries. This discovery uses growth processes compatible with high volume production, CVD growth and thermal annealing, to extend cBN coatings to many application areas previously closed by manufacturing and film quality limitations. In instances where the high temperature deposition process of hBN by CVD is inappropriate, a plasma enhanced CVD method might be used to grown hBN at lower temperatures. It is anticipated that the elemental boron produced in this reaction can be reduced or eliminated by any number of methods. For example, performing the solid state conversion experiment in a mixture of hydrogen and nitrogen gases, or ammonia. Another possibility is to chemically react the converted film with gas such as $Cl_2$, or an acid such as HCl. Of course, the amount of elemental boron produced is probably very sensitive to the temperature at which the film is subjected. The temperature of 867° C. used in our experiments was not obtained through any optimization process, but was the temperature that worked the first time the experiment was tried. Optimization or expansion of the anneal duration, environment and temperature is within the skill of persons in the art. The conversion process may be thermodynamically driven, that is, that the cubic form of boron nitride is more stable than the hexagonal form in the process pressure (0 to 2 to 10 atm) and temperature range (0° to 1000° C.). The conversion process may be accomplished in a hydrogen, nitrogen, $NH_3$ or inert gets atmosphere, or under vacuum.

A significant advantage of the present invention is that the conversion from hBN to cubic-like BN can be accomplished without the high pressures of prior art processes. According to the present invention, starting with an hBN film of poor crystallinity, the film can be converted to cubic-like BN at low pressures, for example below 2 GPa, atmospheric pressure or under vacuum, and at a temperature below 1000° C., for example 900° C. The important difference between the process of the present invention and the process announced by R. Roy is that the present invention does not use a hydrogen plasma but just hydrogen gas, which is contrary to Roy's technique. Since cBN does not grow well by a plasma enhanced hydrogen CVD process, the mechanism by which the graphite is converted to diamond in the Roy experiments seems to be completely different from the hBN to cubic-like BN conversion we have discovered.

The boron nitride films were deposited by the techniques of pulsed laser deposition, and ion-assisted pulsed laser deposition. An apparatus, system and method of making boron nitride films is described in U.S. Pat. No. 5,080,753, the disclosure of which is hereby incorporated by reference. In these techniques, a laser (e.g., excimer) evaporates a ceramic, hexagonal target in either a vacuum or partial pressure of nitrogen (or nitrogen-containing gas). The ion-assisted process utilizes a broad-beam nitrogen ion source that irradiates the film during the deposition. Depending on the deposition conditions, the resulting films can contain either the cubic BN phase, the hexagonal BN phase, or a mixture of both. The films used in this study were entirely hexagonal. The crystallinity of the films has been investigated by means of transmission electron microscopy. It was found that the films were comprised of hexagonal microcrystallites that were less than a few hundred Angstroms in size. The chemical composition of the films was examined by x-ray and electron spectroscopies, and the films were determined to be deficient in nitrogen. Depending on the deposition conditions, the nitrogen deficiency ranges from less than a percent to almost 20 percent.

The solid state conversion process was tried with crystalline hBN powders. The crystallinity of the powders was examined by x-ray diffraction and transmission electron microscopy. The results indicated that the typical crystalline grain size of the powders exceed 1000 A. We repeated the solid state conversion procedure on the hBN powders, hBN powders mixed with cBN powder, and hBN powders mixed with diamond powder. In no instance did the solid state conversion process convert the starting hBN to cBN or cubic-like BN. The cubic-like BN has a majority of $sp^3$ bonds. As shown in FIG. 1, the infrared spectrum at 120 hours (lower trace of FIG. 1) has a dip at about 1400 wavenumbers corresponding to $sp^2$ bonds and a dip at 1060 wavenumbers corresponding to $sp^3$ bonds. Comparing the magnitude of dips corresponding to $sp^3$ bonds and $sp^3$ bonds, the cubic-like BN has less than 10 percent by weight $sp^2$ bond material and more than 90 percent by weight $sp^3$ bond material.

The embodiments of the invention in which an exclusive property or privilege is claimed as defined as follows:

1. A method of solid state conversion of hexagonal to cubic-like boron nitride comprising:
   providing a noncrystalline film comprising hexagonal boron nitride film on a substrate,
   annealing the hexagonal boron nitride film in a gaseous atmosphere at a temperature below 1000° C., at a pressure less than 2 GPa and without a catalyst so that a portion of the hexagonal boron nitride in the film is converted to cubic-like boron nitride.

2. A method as set forth in claim 1 wherein the cubic-like boron nitride consisting essentially of crystalline cubic boron nitride.

3. A method as set forth in claim 1 wherein the substrate comprises silicon.

4. A method as set forth in claim 1 wherein the substrate comprises a metal.

5. A method as set forth in claim 1 wherein the annealing atmosphere further comprises at least one selected from the group consisting of nitrogen, ammonia, helium and argon gas.

6. A method as set forth in claim 1 further comprising the step of reacting the film comprising cubic-like boron nitride with a material selected from the group comprising an acid and a gas to remove elemental boron produced in the film.

7. A method as set forth in claim 6 wherein the reacting gas comprises chlorine.

8. A method as set forth in claim 6 wherein the acid comprises HCl.

9. A method as set forth in claim 1 wherein said gaseous atmosphere comprises hydrogen.

10. A method of solid state conversion of hexagonal to cubic-like boron nitride comprising:
    providing a film comprising hexagonal boron nitride having limited crystalline structure on a substrate,
    heating the hexagonal boron nitride film in a furnace to a temperature ranging from about 600° C. to less than 1000° C., at a pressure less than 2 GPa and without a catalyst,
    gradually cooling the film so that a portion of the hexagonal boron nitride film is converted to cubic-like boron nitride.

11. A method as set forth in claim 9 wherein said atmosphere further comprises at least one selected from the group consisting of nitrogen gas, ammonia, argon and helium.

12. A method as set forth in claim 1 wherein said cubic-like boron nitride film includes a major portion of $sp^3$ bonded material.

13. A method as set forth in claim 1 wherein said cubic-like boron nitride film comprises 90 percent by weight $sp^3$ bonded material.

14. A method as set forth in claim 1 wherein said process is conducted at a pressure below atmospheric pressure.

15. A process as set forth in claim 10 wherein said process is conducted at a pressure below atmospheric pressure.

* * * * *